United States Patent
Waheed et al.

(10) Patent No.: US 9,608,587 B2
(45) Date of Patent: Mar. 28, 2017

(54) SYSTEMS AND METHODS TO DYNAMICALLY CALIBRATE AND ADJUST GAINS IN A DIRECT CONVERSION RECEIVER

(71) Applicant: FREESCALE SEMICONDUCTOR, INC., Austin, TX (US)

(72) Inventors: Khurram Waheed, Austin, TX (US); Steven M Bosze, Cedar Park, TX (US); Keith A Tilley, Austin, TX (US); Kevin B Traylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/749,884

(22) Filed: Jun. 25, 2015

(65) Prior Publication Data
US 2016/0380788 A1 Dec. 29, 2016

(51) Int. Cl.
H03G 3/30 (2006.01)
H04L 25/06 (2006.01)
H03D 3/00 (2006.01)

(52) U.S. Cl.
CPC .......... *H03G 3/3078* (2013.01); *H03D 3/008* (2013.01); *H03G 3/3068* (2013.01); *H04L 25/061* (2013.01); *H04L 25/066* (2013.01); *H03D 3/009* (2013.01)

(58) Field of Classification Search
CPC .... H03G 3/3068; H03G 3/3078; H03D 3/008; H03D 3/009; H04L 25/061; H04L 25/066
See application file for complete search history.

(56) References Cited

U.S. PATENT DOCUMENTS

| | | |
|---|---|---|
| 6,516,185 B1 | 2/2003 | MacNally |
| 6,560,448 B1 | 5/2003 | Baldwin et al. |
| 6,735,422 B1 | 5/2004 | Baldwin et al. |
| 6,868,128 B1 | 3/2005 | Lane |
| 6,941,121 B2 | 9/2005 | Chen |

(Continued)

FOREIGN PATENT DOCUMENTS

EP 1524811 B1 4/2005

OTHER PUBLICATIONS

Gil et al., "Joint ML estimation of carrier frequency, channel, I/Q mismatch, and DC offset in communication receivers," in IEEE Transactions on Vehicular Technology, vol. 54, No. 1, pp. 338-349, Jan. 2005.*

(Continued)

*Primary Examiner* — Michelle M Koeth

(57) ABSTRACT

Method embodiments are provided herein for dynamically calibrating and adjusting a direct conversion receiver system. One embodiment includes applying one or more gain control signals to one or more gain elements of a receiver system, where the applying one or more gain control signals results in a gain change to the receiver system; in response to the gain change, determining whether the receiver system exhibits a DC (direct conversion) offset; and in response to a determination that the receiver system exhibits the DC offset, applying one or more DC offset correction control signals to one or more gain elements of the receiver system, where the one or more DC offset correction signals are configured to correct the DC offset.

20 Claims, 4 Drawing Sheets

(56) References Cited

U.S. PATENT DOCUMENTS

| | | | |
|---|---|---|---|
| 7,030,795 | B1 | 4/2006 | Saunders et al. |
| 7,146,141 | B2 | 12/2006 | Chen |
| 7,348,808 | B2 | 3/2008 | Moussavi |
| 7,353,010 | B1 | 4/2008 | Zhang et al. |
| 7,397,304 | B2 | 7/2008 | Wang |
| 7,472,101 | B2 * | 12/2008 | Aurora .................. G06F 8/31 706/2 |
| 7,522,900 | B2 | 4/2009 | Allott et al. |
| 7,548,738 | B2 | 6/2009 | Srinivasan et al. |
| 7,890,075 | B2 | 2/2011 | Xin et al. |
| 7,899,431 | B2 | 3/2011 | Rahman et al. |
| 7,929,650 | B2 | 4/2011 | Sobchak et al. |
| 8,010,077 | B2 | 8/2011 | Ivonnet et al. |
| RE42,799 | E | 10/2011 | Baldwin et al. |
| 8,150,360 | B2 | 4/2012 | Ivonnet et al. |
| 8,260,235 | B1 | 9/2012 | Khlat |
| 8,525,586 | B2 | 9/2013 | Chen |
| 8,545,411 | B2 | 10/2013 | Bae et al. |
| 8,588,719 | B1 | 11/2013 | Mehrotra |
| 8,614,603 | B1 | 12/2013 | Wyse et al. |
| 8,615,212 | B2 * | 12/2013 | Li ..................... H03G 3/3068 455/239.1 |
| 8,626,099 | B2 | 1/2014 | Li et al. |
| 8,638,883 | B2 | 1/2014 | Ashkenazi |
| 8,666,343 | B2 | 3/2014 | Shanan |
| 9,264,280 | B1 | 2/2016 | Waheed et al. |
| 2002/0042256 | A1 | 4/2002 | Baldwin et al. |
| 2002/0120937 | A1 | 8/2002 | Chang |
| 2002/0197975 | A1 | 12/2002 | Chen |
| 2003/0081693 | A1 | 5/2003 | Raghavan et al. |
| 2003/0100286 | A1 | 5/2003 | Severson et al. |
| 2003/0199264 | A1 | 10/2003 | Holenstein et al. |
| 2004/0157573 | A1 | 8/2004 | Lee et al. |
| 2006/0222117 | A1 | 10/2006 | Rahman et al. |
| 2007/0004359 | A1 | 1/2007 | Srinivasan et al. |
| 2007/0058739 | A1 * | 3/2007 | Aytur .................. H03G 3/3068 375/260 |
| 2007/0190960 | A1 | 8/2007 | Akamine et al. |
| 2008/0165899 | A1 | 7/2008 | Rahman et al. |
| 2008/0273636 | A1 * | 11/2008 | Zhu ..................... H03G 3/3078 375/345 |
| 2009/0264090 | A1 | 10/2009 | Ivonnet et al. |
| 2010/0172450 | A1 * | 7/2010 | Komaili ............. H04L 27/3809 375/345 |
| 2011/0105070 | A1 | 5/2011 | Li et al. |
| 2012/0034895 | A1 | 2/2012 | Xuechu et al. |
| 2012/0155347 | A1 * | 6/2012 | Husted ............. H04W 52/0229 370/311 |
| 2013/0082682 | A1 | 4/2013 | Horvath |
| 2013/0102267 | A1 * | 4/2013 | Haub ..................... H04B 1/10 455/296 |
| 2013/0195215 | A1 | 8/2013 | Manglani et al. |

OTHER PUBLICATIONS

Gil et al., "Joint ML estimation of carrier frequency, channel, I/Q mismatch, and DC offset in communication receivers," in I EEE Transactions on Vehicular Technology, vol. 54, No. 1, pp. 338-349, Jan. 2005.*

Waheed, et al., U.S. Appl. No. 14/603,443, "Automatic Receiver Gain Control", filed Jan. 23, 2015.

Waheed, et al., U.S. Appl. No. 14/565,745, "DC Offset Calibration of Wireless Receivers", filed Dec. 10, 2014.

Waheed, et al., U.S. Appl. No. 14/604,291, "DC Offset Tracking of Wireless Receivers", filed Jan. 23, 2015.

Non-final Rejection—U.S. Appl. No. 14/603,443, May 29, 2015, 13 pages.

Notice of Allowance—U.S. Appl. No. 14/603,443, Oct. 30, 2015, 7 pages.

Office Action—U.S. Appl. No. 14/565,745, Feb. 26, 2016, 4 pages.

Office Action—Final—U.S. Appl. No. 14/565,745, Aug. 10, 2016, 28 pages.

* cited by examiner

SYSTEMS AND METHODS TO DYNAMICALLY CALIBRATE AND ADJUST GAINS IN A DIRECT CONVERSION RECEIVER

BACKGROUND

Field

This disclosure relates generally to radio frequency receivers, and more specifically, to dynamic impairment compensation in direct conversion (DC) radio frequency receivers.

Related Art

Direct conversion receivers (DCRs) convert a radio frequency (RF) carrier waveform directly to baseband. Optimal signal reception requires the receiver gains, linearity, I and Q signal gain and phase mismatch, direct current voltage (DC) offsets and tuning parameters to be setup accurately for accurate reception of the down-converted antenna signal. Receiver impairments such as inadequate carrier suppression, second order inter-modulation, device level mismatches and inherent offsets in the active circuits of the receiver front end all contribute to a DC offset bias level in the down-converted baseband signal that needs to be corrected or compensated. Similarly, in-phase/quadrature (I/Q) path mismatches such as local oscillator (LO) generated noise (or equivalent), mismatches between I/Q path circuits and parasitics, and gain mismatches between I/Q path baseband circuits and data converters exhibit as IQ phase and gain imbalance.

Such DCR artifacts can seriously impede normal operation of a receiver by causing saturation and creating race conditions for transceiver state machines resulting in, e.g., automatic gain control failure, calibration out-of-range, ADC dynamic range wastage and/or incorrect demodulation and hence incorrect symbol recovery by a modem.

Receiver artifacts on silicon are implementation dependent and are impacted by the process technology node, layout, routing parasitics as well as specific circuit topology. In addition, the receiver impairments tend to be a function of process, voltage, temperature, RF frequency as well as external board level factors such as PCB layout and components.

DCR operation requires a highly coordinated factory trim, calibration, compensation and sequencing strategy for successful reception over a range of operational parameters.

BRIEF DESCRIPTION OF THE DRAWINGS

The present invention may be better understood, and its numerous objects, features, and advantages made apparent to those skilled in the art by referencing the accompanying drawings.

Embodiments of the present invention are illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

The present disclosure provides a direct conversion receiver (DCR) system and a method of operating a direct conversion receiver with multiple interactive compensation control structures including autonomous gain control (AGC) and receiver artifact mitigation such as in-phase/quadrature (IQ) mismatch and DC offset compensations targeted for receivers to be used for wireless connectivity. Some of the key operational steps and control interactions between various components of the direct conversion receiver architecture include receiver calibration of IQ gain and phase mismatch, receiver warm-up calibration of DC offsets using calibrated IQ mismatch, fast adaptation to optimal operational receiver gain using high and low signal level tracking along the receiver path at transconductance and baseband filter outputs, calibrated DC offset and IQ mismatch compensation applied as a function of receiver gain, and the ability to fine tune operational receiver gain based on a wide-band received signal strength indicator (RSSI) estimate of ADC signal level. When the AGC gain settles, a DC tracking loop is executed for a prescribed time to remove residual DC offset errors due to calibration quantization and dynamic effects by applying an updated DC correction. During normal operation, the received signal level is tracked using RSSI measurement and the receiver gain is adjusted, if needed. Changes in the receiver gain due to the arrival or departure of a blocking signal based on either peak (or clip) detector trigger or a sampled RSSI step change can be made quickly once detected. Once a signal stream is in active reception, a precise narrow-band RSSI measurement is measured for selection of best routing path, etc. by higher layers of software.

Example Embodiments

Figure 1:
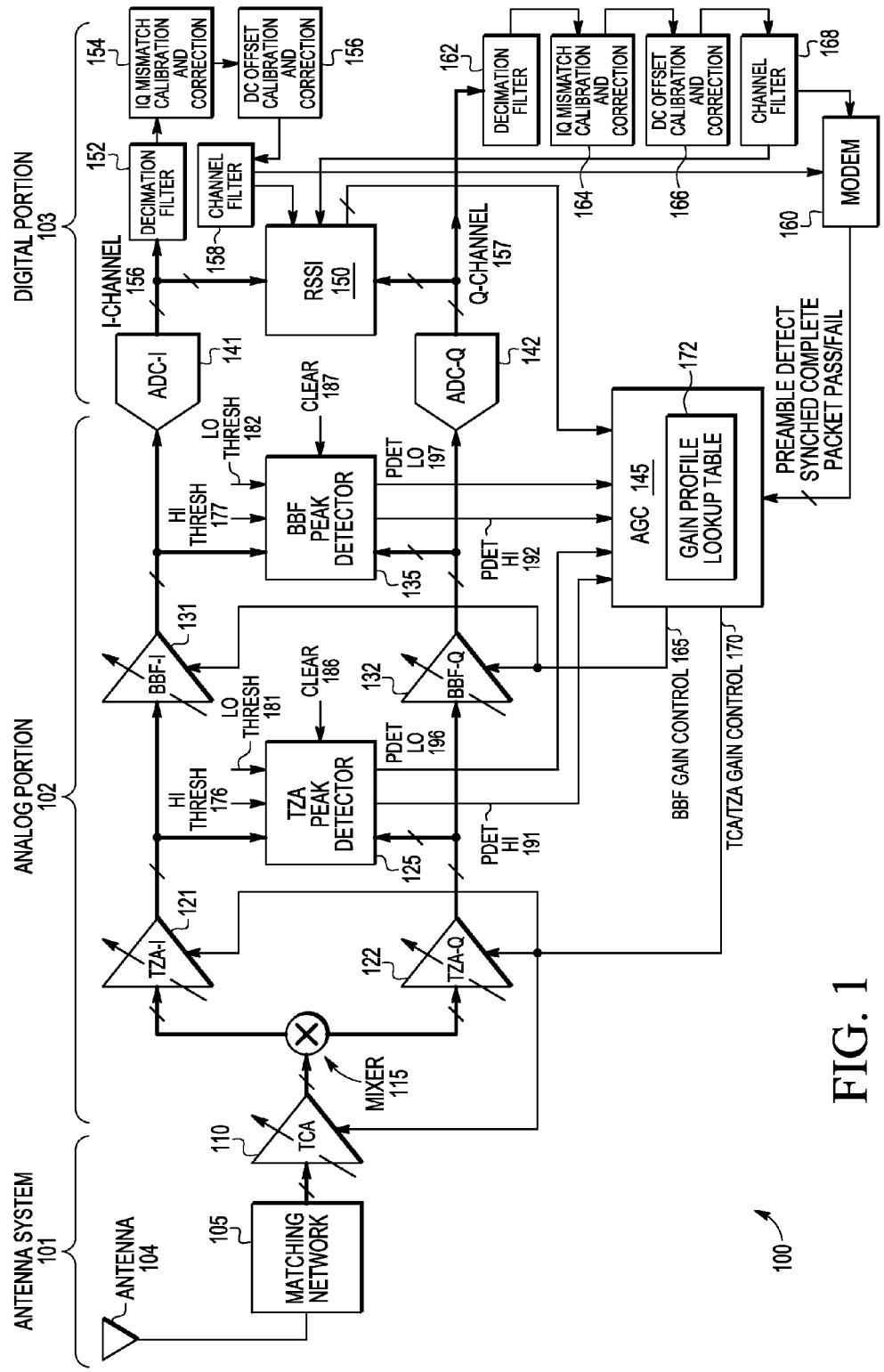
FIG. 1 illustrates a block diagram depicting an example receiver system in which the present disclosure is implemented, according to some embodiments.

FIG. 1 illustrates a block diagram depicting an example receiver system 100 in which the present disclosure is implemented. Although a number of components are illustrated in a particular arrangement in FIG. 1, receiver system 100 may include additional or fewer components and such components may have a different arrangement. It is noted that analog portion 102 includes thick lines having slash marks, where such thick lines indicate differential signals in some embodiments. In other embodiments, such signals need not be differential and instead may be single-ended signals. It is also noted that digital portion 103 includes thick lines having slash marks, which indicate a digital multi-bit data bus signal.

Receiver system 100 includes an antenna system 101, an analog portion 102, and a digital portion 103 for receiving RF (radio frequency) signals. Antenna system 101 includes antenna 104 and matching network 105. Analog portion 102 includes a transconductance amplifier (TCA) 110, a mixer 115, a first transimpedance amplifier (TZA-I) 121 for an in-phase signal path (I-path), a second transimpedance amplifier (TZA-Q) 122 for a quadrature signal path (Q-path), a first baseband filtering amplifier (BBF-I) 131 for the I-path, a second baseband filtering amplifier (BBF-Q) 132 for the Q-path, a transimpedance amplifier (TZA) peak detector 125, and a baseband filtering amplifier (BBF) peak detector 135. Analog portion 102 also includes an initial portion of a first analog-to-digital converter (ADC-I) 141 for the I-path and an initial portion of a second analog-to-digital converter (ADC-(Q) 142 for the Q-path. The combination of TCA 110, TZA-I 121, and TZA-Q 122 may also be referred to herein as a low noise amplifier (LNA). Digital portion 103 includes a remaining portion of ADC-I 141 and a remaining portion of ADC-Q 142, a received signal strength indication (RSSI) module 150, and an automatic gain control (AGC) module 145. Each of these components are implemented, at least in part, as circuitry. TCA, TZA-I, TZA-Q, BBF-I, and BBF-Q, components are considered to be gain elements of receiver system 100. The components of receiver system 100 are further discussed below.

In antenna system 101, antenna 104 is configured to receive a signal and provide the signal to matching network 105. Matching network 105 is configured to suppress out-of-band RF signals and result in improved impedance matching between the antenna and the TCA 102 input. This allows for coupling of the received in-band RF antenna signal to the analog portion 102 of receiver system 100. In some embodiments, matching network 105 is also configured to transform the single-ended antenna signal into a differential voltage signal (e.g., by using a balun or similar device to produce a negative voltage signal and a positive voltage signal of equal magnitude), while also matching the single ended impedance of the antenna to the differential input impedance of the analog portion of receiver system 100. Matching network 105 provides the RF input signal to TCA 110.

In analog portion 102 of receiver system 100, TCA 110 is configured to receive the voltage signal (e.g., single-ended or differential) from matching network 105 and to output a current signal proportional to the received voltage signal based on a programmable gain of TCA 110. The current signal is then provided to mixer 115 that is configured to mix the current signal with a local oscillator signal to produce an I-path current signal that is provided to TZA-I 121, and to mix the current signal with another signal from the local oscillator to produce a Q-path current signal that is provided to TZA-Q 122. The second local oscillator signal is 90° offset (or delayed in time) from the first local oscillator signal. The first and second local oscillator signals may be set at a same frequency (e.g., 2.4 GHz).

TZA-I 121 is configured to receive the I-path current signal and output an I-path voltage signal proportional to the I-path current signal based on a programmable gain of TZA-I 121. TZA-Q 122 is configured to receive the Q-path current signal and output a Q-path voltage signal proportional to the Q-path current signal based on a programmable gain of TZA-Q 122. TCA, TZA-I, and TZA-Q each receive a gain control signal that programs the respective gain of TCA, TZA-I and TZA Q. In some embodiments, a single (e.g., tied) gain control signal is provided to TCA, TZA-I, and TZA-Q, which is illustrated in FIG. 1 as TCA/TZA gain control 170. In other embodiments (not shown), separate and independent gain control signals are provided to TCA, TZA-I, and TZA-Q. The total gain realized comprises the gain in TCA, typically a down-conversion loss in the mixer, and gain realized in the TZA stage (and/or an active mixer).

TZA peak detector 125 is configured to receive the I-path voltage signal and the Q-path voltage signal, a programmable high threshold value 176, a programmable low threshold value 181, and a clear signal 186. TZA peak detector 125 is configured to detect whether the I-path and Q-path voltage signals exceed a high threshold specified by high threshold value 176 and exceed a low threshold specified by low threshold value 181. In response to detection of either the I-path voltage signal and the Q-path voltage signal exceeding the high threshold, TZA peak detector 125 is configured to immediately output a high peak detection signal (illustrated as pdet_hi 191 in FIG. 1) to notify AGC module 145. In response to detection of either the I-path voltage signal and the Q-path voltage signal exceeding the low threshold, TZA peak detector 125 is configured to immediately output a low peak detection signal (illustrated as pdet_lo 196 in FIG. 1) to notify AGC module 145. TZA peak detector 125 is configured to be disabled or reset in response to clear signal 186 being triggered, where the I-path and Q-path voltage signals are ignored during the time that clear signal 186 is triggered. Clear signal 186 is triggered by AGC module 145 after AGC module 145 applies a gain adjustment or change to one or more gain elements in receiver system 100, as further discussed below.

BBF-I 131 is configured to receive the I-path voltage signal and output a filtered I-path voltage signal proportional to the received I-path voltage signal based on a programmable gain of BBF-I. BBF-Q 132 is configured to receive the Q-path voltage signal and output a filtered Q-path voltage signal proportional to the received Q-path voltage based on a programmable gain of BBF-Q. BBF-I and BBF-Q are each configured to pass frequency signals inside of a configured frequency interval of (0,B), where B is the cutoff frequency of the baseband filter. The cutoff frequencies of BBF-I and BBF-Q are set to allow for signals within a desirable frequency bandwidth of the I-path voltage signal and the Q-path voltage signal, respectively, to propagate to ADC-I and ADC-Q.

BBF peak detector 135 is configured to receive the filtered I-path voltage signal and the filtered Q-path voltage signal, a programmable high threshold value 177, a programmable low threshold value 182, and a clear signal 187. BBF peak detector 135 is configured to detect whether the filtered I-path and filtered Q-path voltage signals exceed a high threshold specified by high threshold value 177 and exceed a low threshold specified by low threshold value 182. In response to detection of either the filtered I-path voltage signal and the filtered Q-path voltage signal exceeding the high threshold, BBF peak detector 135 is configured to immediately output a high peak detection signal (illustrated as pdet_hi 192 in FIG. 1) to notify AGC module 145. In response to detection of either the filtered I-path voltage signal and the filtered Q-path voltage signal exceeding the low threshold, BBF peak detector 135 is configured to immediately output a low peak detection signal (illustrated as pdet_lo 197 in FIG. 1) to notify AGC module 145. BBF peak detector 135 is configured to be disabled or reset in response to clear signal 187 being triggered, where the filtered I-path and filtered Q-path voltage signals are ignored during the time that clear signal 187 is triggered. Clear signal 187 is triggered by AGC module 145 after AGC module 145 applies a gain adjustment or change to one or more gain elements or AGC states in receiver system 100, as further discussed below.

ADC-I 141 is configured to receive the filtered I-path voltage signal and ADC-Q 142 is configured to receive the filtered Q-path voltage signal. In the digital portion 103 of receiver 100, ADC-I 141 is further configured to output a digital signal that represents the filtered I-path voltage signal, illustrated in FIG. 1 as I-channel 156. ADC-Q 142 is further configured to output a digital signal that represents the filtered Q-path voltage signal, illustrated in FIG. 1 as Q-channel 157. I-channel and Q-channel are available for further digital processing.

For the in-phase path of receiver system 100, decimation filter 152 receives I-channel 156 and can include a low pass filter to remove high frequency components of I-channel 156 as well as a downsampler that retains every Mth sample of the filtered I-channel 156. The filtered and downsampled I-channel signal is then provided to I/Q mismatch calibration and correction module 154, which uses any suitable I/Q calibration and correction technique(s) to remove I-channel 156 mismatch and leakage. The output of I/Q mismatch calibration and correction module 154 is provided to DC offset calibration and correction module 156. DC offset in a signal is a measure of the mean amplitude displacement of the signal from zero. In a Cartesian receiver, I and Q paths are in quadrature to each other and as such a presence of DC offset in I and Q paths causes the received signal to be not co-centric with the quadrature origin (i.e, I=Q=0). Such a two-dimensional DC impairment is also referred to as origin offset. Any suitable DC offset calibration and correction technique(s) can be used to remove receiver impairments such as inadequate carrier suppression, 2nd order inter-modulation, mismatches and inherent offsets in the active circuits of the analog front end 102, which all contribute to a DC offset in the down-converted baseband signal. The output of DC offset calibration and correction module 156 is provided to channel filter 158 that passes the processed I/Q signal at a frequency range of interest while attenuating or rejecting frequencies outside the range of interest. The output of channel filter 158 is provided to RSSI module 150 and to modem 160.

For the quadrature path of receiver system 100, decimation filter 162 receives Q-channel 157 and can include a low pass filter to remove high frequency components of Q-channel 157 as well as a downsampler that retains every Mth sample of the filtered Q-channel 157. The filtered and downsampled Q-channel signal is then provided to I/O mismatch calibration and correction module 164, which uses any suitable I/Q calibration and correction technique(s) to remove mismatch and leakage. The output of I/Q mismatch calibration and correction module 164 is provided to DC offset calibration and correction module 157. Any suitable DC offset calibration and correction technique(s) can be used to remove receiver impairments such as inadequate carrier suppression, 2nd order inter-modulation, mismatches and inherent offsets in the active circuits of the analog front end 102, which all contribute to a DC offset in the down-converted baseband signal. The output of DC offset calibration and correction module 166 is provided to channel filter 168 that passes the processed I/Q signal at a frequency range of interest while attenuating or rejecting frequencies outside the range of interest. The output of channel filter 168 is provided to RSSI module 150 and to modem 160.

Modem 160 receives the processed I-channel 156 and Q-channel 157 signals and provides control signals to AGC 145 such as a preamble detect indicator, a synchronization complete indicator, and a packet pass/fail indicator. The preamble detect indicator is set when a preamble to a packet of information is detected, according to the communication protocol used by modem 160. The synchronization complete indicator is set by modem 160 when synchronization with the incoming data has been achieved. During packet reception in modem 160, a preamble pattern is identified by the modem and a PREAMBLE_DETECT flag is asserted to identify presence of a potential packet. The second stage is the identification of a synchronization pattern in the packet. This synchronization word is called an access address or a network address in most standards. The IEEE 802 standard refers to the synch word as Start of Frame Delimiter (SFD). The purpose of either structure in a packet is to achieve both timing and frequency synchronization to an incoming packet (called SYNCH_DETECT) so that the packet payload can be demodulated properly. The RSSI can be computed continuously until a sync word is detected. The packet pass/fail indicator is set to indicate pass when a packet is received correctly, and to indicate fail when a packet has not been received correctly.

Note that achieving a SYNCH_DETECT state in the RX implies that the PHY is receiving a valid packet and as such an indication from the PHY can be potentially used by the receiver pre-modem digital signal processing engine to freeze the AGC. Trigger start of narrow-band RSSI measurement.

RSSI module 150 is configured to receive I-channel and Q-channel and to calculate a power measurement, also referred to as an RSSI level, of each of the I-channel and Q-channel. RSSI module 150 is also configured to detect whether the RSSI levels of the I-channel and Q-channel exceed a programmable high RSSI threshold and whether the RSSI levels fail to exceed a programmable low RSSI threshold. RSSI module 150 is also configured to detect whether a change in RSSI levels for either the I-channel and the Q-channel exceeds a programmable delta RSSI threshold, and whether the headroom of the ADC (or the difference between the expected operating signal level and a maximum level that the ADC can pass without signal clipping) exceeds or fails to exceed a programmable headroom threshold. RSSI module 150 is configured to immediately output a number of RSSI detection signals corresponding to each of these RSSI detections to notify AGC module 145.

AGC module 145 is configured to receive detection signals from TZA peak detector, BBF peak detector, and RSSI circuit. AGC module 145 is also configured to monitor whether the low peak detection signals received from TZA and BFF peak detectors are received within a low peak monitoring window, which is some programmable amount of time. Each time AGC module 145 receives a low peak detection signal from a peak detector (e.g., from either TZA or BBF peak detectors), AGC module 145 resets the monitoring window. AGC module 145 then detects whether the monitoring window has expired (due to the signal failing to exceed the low threshold within the monitoring window). In some embodiments, each peak detector is associated with a respective monitoring window.

In response to receipt of one or more detection signals and expiration of the monitoring window, AGC module 145 is configured to consult a gain profile lookup table 172 using the detection signal(s) and monitoring window expiration as index criteria for looking up a particular gain profile to implement in receiver system 100. The gain profile lookup table 172 indicates the gain values of the gain control signals 170 and 165, based on conditions of the receiver system 100 as indicated by the detection signals. AGC module 145 is then configured to apply a valid gain adjustment or change to one or more gain elements in receiver system 100 by outputting a TCA/TZA gain control signal 170 and a BBF gain control signal 165 that reflects the valid gain adjustment. As noted above, in some embodiments, a single (e.g., tied) TCA/TZA gain control signal 170 is provided to TCA, TZA-I, and TZA-Q. In other embodiments (not shown), separate and independent gain control signals are provided to TCA, TZA-I, and TZA-Q.

A high peak detection signal, such as pdet_hi signal 191 or 192, is generated when the peak detector determines that input signal exceeds either the positive or negative value of a corresponding high threshold value 176, 177. A low threshold value, such as low threshold value 181 or 182, is provided to the peak detector at both positive and negative values. A low peak detection signal, such as pdet_lo signal 196 or 197, is generated when the peak detector determines that the input signal exceeds either the positive or negative value of the corresponding low threshold. In some embodiments, a set of high and low threshold values is defined for each peak detector implemented in receiver system 100, such as one set of threshold values for TZA peak detector 125 and another set of threshold values for BBF peak detector 135.

In response to the amplitude of the input signal exceeding the negative value of the high threshold, the peak detector generates high peak detection signal (pdet_hi) to notify AGC module 145. In response to detection signal pdet_hi, the AGC controls the gain of one or more of the gain elements in receiver system 100 in order to scale down the input signal to remain within the positive and negative values of the high threshold.

In response to the amplitude of the input signal exceeding a low threshold, the peak detector 135 generates detection signal pdet_lo. In response to receipt of pdet_lo signal, AGC module 145 resets the monitoring window. In some embodiments, AGC module resets the monitoring window associated with the pdet_lo signal (e.g., the monitoring window associated with the peak detector that generated the pdet_lo signal). The peak detector continues detecting whether the amplitude of the input signal exceeds the low threshold.

The monitoring window is repeatedly reset by the AGC module 145 each time pdet_lo signal is received (e.g., each time AGC module 145 monitors or checks whether pdet_lo signal is received). The AGC module 145 continues to monitor and reset the associated monitoring window in this manner as the pdet_lo signal is received. AGC module 145 also resets or clears the pdet_lo and pdet_hi signals.

Although the examples described herein include peak detection in the analog domain, i.e., before the analog to digital conversion, other embodiments can include peak detection in the digital domain, i.e., after the analog to digital conversion.

Figure 2:
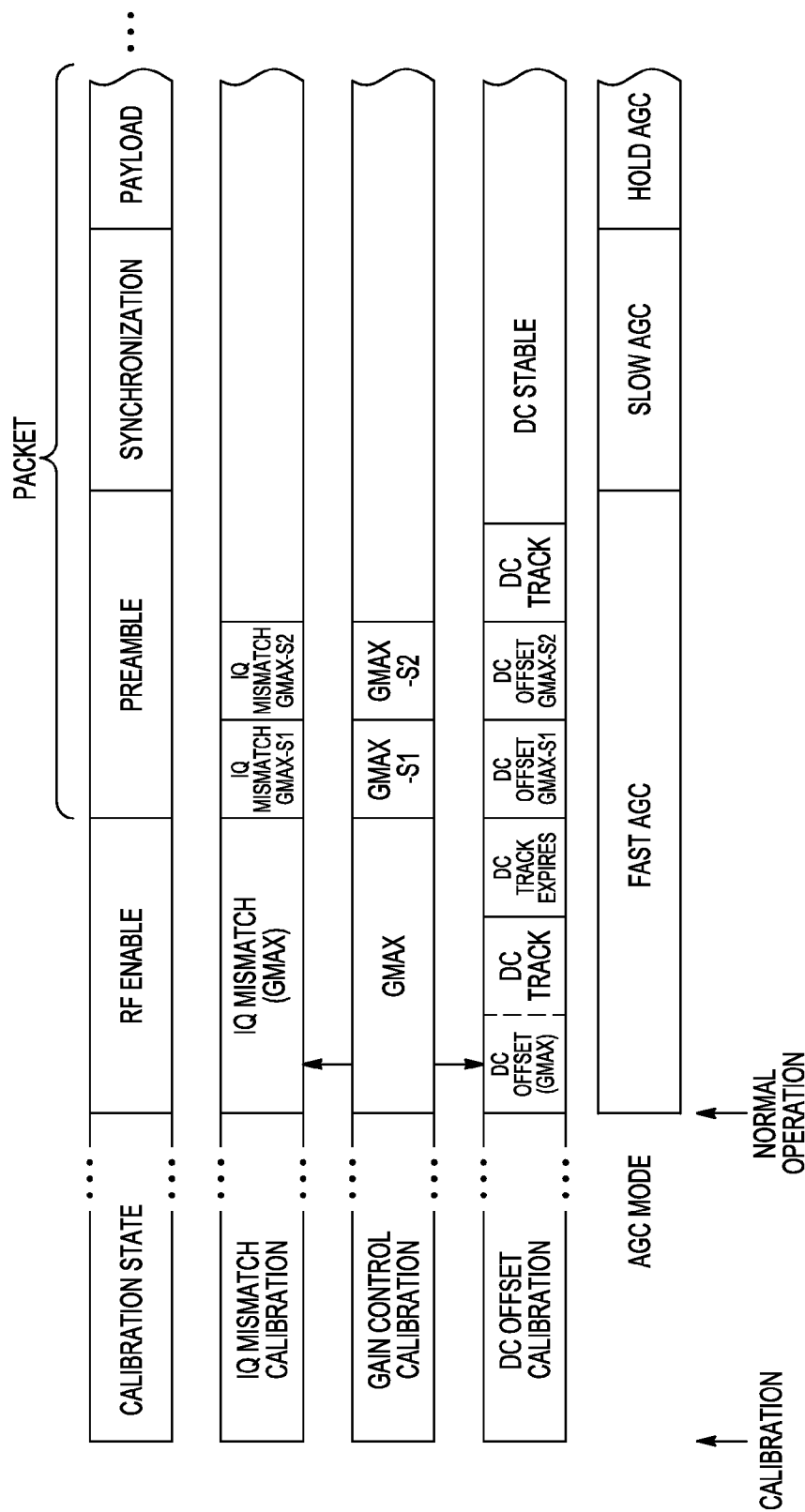
FIG. 2 illustrates a timing diagram depicting a sequence of various operations of the receiver system 100 of FIG. 1, according to some embodiments.

Referring to FIGS. 1 and 2, FIG. 2 illustrates a timing diagram depicting a sequence of various operations of the receiver system 100 of FIG. 1, according to some embodiments. In the example shown, receiver system 100 operates in a calibration state, an RF enable state, a preamble state, a synchronization state, and a payload state. The RF enable, preamble, synchronization, and payload states are part of normal operation of receiver system 100. During the calibration state, I/Q mismatch calibration, gain control calibration, and DC offset calibration are performed. The calibration may be performed by a manufacturer before being provided to a user, or in the field after being provided to the user. Any suitable calibration techniques such as adaptive algorithms, maximization of a RX performance metric, minimization of a RX degradation metric, min-max algorithms, successive approximation, and fixed, multi-point approximation, among others, can be used.

During the RF enable state, receiver system 100 has been calibrated and powered on or reset/cleared for normal operation. AGC module 145 enters a fast AGC state in which receiver system 100 is initialized at a maximum front-end gain (e.g., TCA/TZA and BBF are set to a maximum gain) and corresponding settings for parameters in IQ mismatch calibration and correction module 164 and DC offset calibration and correction module 166 are set. During the RF enable state, DC offset calibration and correction module 164 monitors performance during a DC track phase by tracking the DC offset variation over time using a suitable filter or other technique. The DC offset is tracked for a portion of the RF enable time period until the DC track phase expires. Alternatively, the DC offset can be tracked continuously.

When a preamble of a packet is detected, the state of receiver system 100 transitions to the preamble state, during which AGC module 145 varies the gain in TZA-I 121, TZA-Q 122, BBF-I 131 and BBF-Q 132 by two or more values until acceptable signal reception is achieved and DC tracking indicates little or no variation in the DC offset. For example, the maximum gains used in the RF enable state can be reduced to successively lower levels until the RSSI module 150 and peak detectors 125, 135 indicate the processed signal is within an acceptable range with little or no clipping or DC offset. Once the DC offset is stable, DC offset calibration and correction module 166 enters a DC stable mode.

AGC module 145 controls the gain profile in receiver system 100 and monitors peak detectors 125, 135 and RSSI module 150 for any detection signals that indicate a change in gain is required. From a fast AGC state, AGC module 145 can transition to a preslow state upon detecting that the front-end gain is equal to a minimum front-end gain level, indicating that front-end gain cannot be further reduced, or upon detection that a fast gain change detection window has expired (e.g., detection of a gain adjustment resets the fast gain change detection window or time period, and expiration of the fast gain change detection window indicates that no gain adjustments have been made during the fast gain change detection window). Once in the preslow state, AGC module 145 monitors digital measurements and detections of RSSI circuit, such as the ADC headroom of ADC-I and ADC-Q, which is the difference between a maximum amplitude of the passed signal and the maximum amplitude that can be handled by the ADC without clipping or loss of the signal (also referred to as a saturation level). If the ADC headroom is greater or equal to the headroom threshold (indicating that the present headroom is satisfactory), receiver system 100 enters the synchronization state and AGC module 145 transitions to the slow AGC state.

When a packet payload is received, receiver system 100 enters the payload state and AGC module 145 transitions to a hold AGC state, during which the gain profile of receiver system 100 remains steady until the payload is received, or a failure to receive the payload is detected. If a failure is detected, AGC module 145 can transition back to the fast AGC state to adjust the gain profile quickly.

Figure 3:
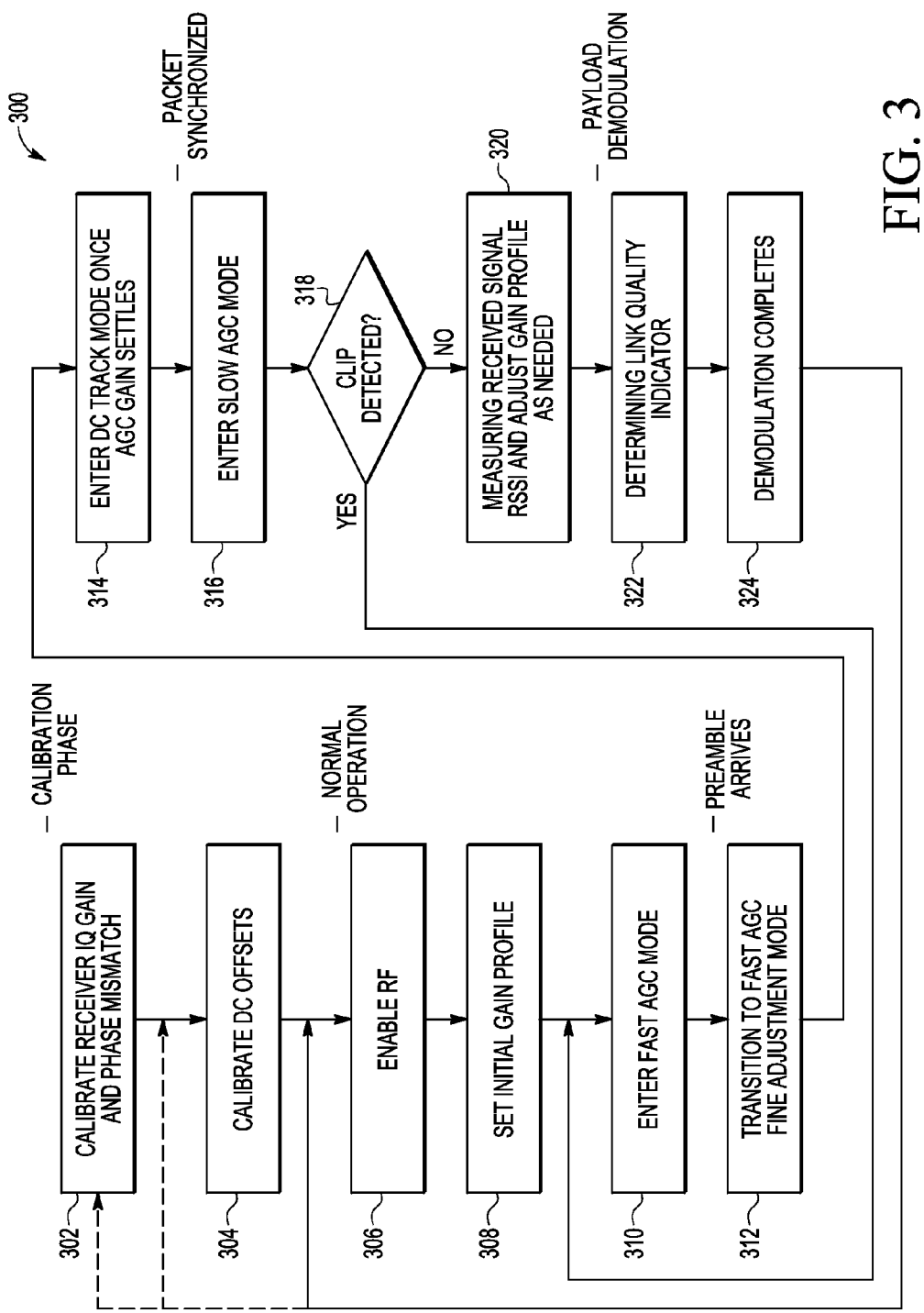
FIG. 3 illustrates a flowchart of an example a method of operating the receiver system of FIG. 1 during various phases of operation, according to some embodiments.

Referring to FIGS. 1 and 3, FIG. 3 illustrates a flowchart of an example a method 300 of operating receiver system 100 of FIG. 1 during various phases of operation, according to some embodiments. During the start of the calibration phase, process 302 includes calibrating the I/Q gain and phase mismatch of receiver system 100 using any suitable technique(s). Process 304 includes calibrating DC offset using any suitable technique. The I/Q and DC offset calibration can be conducted in parallel or sequentially.

Once receiver system 100 is calibrated to correct and remove or reduce DC offset and IQ mismatch, receiver system 100 can enter a normal operation mode. During normal operation, process 306 includes enabling RF reception to start receiving data packets. Process 308 includes setting an initial gain profile for receiver system 100 including gains and other operational parameters for TZA-I 121, TZA-Q 122, BBF-I 131 and BBF-Q 132. The initial gain for receiver system 100 may be at a maximum level, which is reduced to a lower level to receive packets without saturating receiver system 100. Once the initial gain profile is set, process 310 can include entering a fast AGC mode in which AGC module 145 varies the gain profile in relatively large increments until receiver system 100 meets performance specifications within a selected tolerance.

When a preamble to a packet of data is received, receiver system 100 can enter a preamble state where AGC module 145 transitions to a fine adjustment (also referred to as "preslow") mode where the gain profile is adjusted in one or more relatively small increments until desired performance is achieved in receiver system 100. Once the gain profile settles, process 314 causes receiver system 100 to enter a DC track mode to track the DC offset variation over time using a suitable filter or other technique. The DC offset is tracked for a portion of the RF enable time period until the DC offset becomes stable.

After the preamble mode, receiver system 100 enters a packet synchronization mode, which triggers AGC module 145 to enter a slow AGC mode in process 316. Because a viable packet is already being detected, fast changes in the RX gain or DC are avoided unless absolutely necessary. A synchronization complete indicator can be set when the gain is set to a value that causes the RSSI to be within a desired range during this mode. If the input signal is clipped once the AGC module 145 is in the slow mode, process 318 transitions to process 310 to allow ACG module 145 to enter the fast AGC mode and quickly adjust the gain profile of receiver system 100. If the input signal is not clipped during the synchronization state, process 320 measures the received signal RSSI and adjusts the gain profile as needed. A gain adjustment indicator (e.g., pdet_hi, pdet_lo, RSSI) can be used in the receiver system when an adjustment to the gain profile is required.

From the synchronization state, receiver system 100 enters a payload demodulation state when a payload of a packet is received. Process 322 determines a link quality indicator (LQI), which indicates the number of packet errors that occur as the packet is demodulated. When demodulation of the packet completes, process 324 transitions back to process 302, 304, or 306, depending on the particular implementation.

Figure 4:
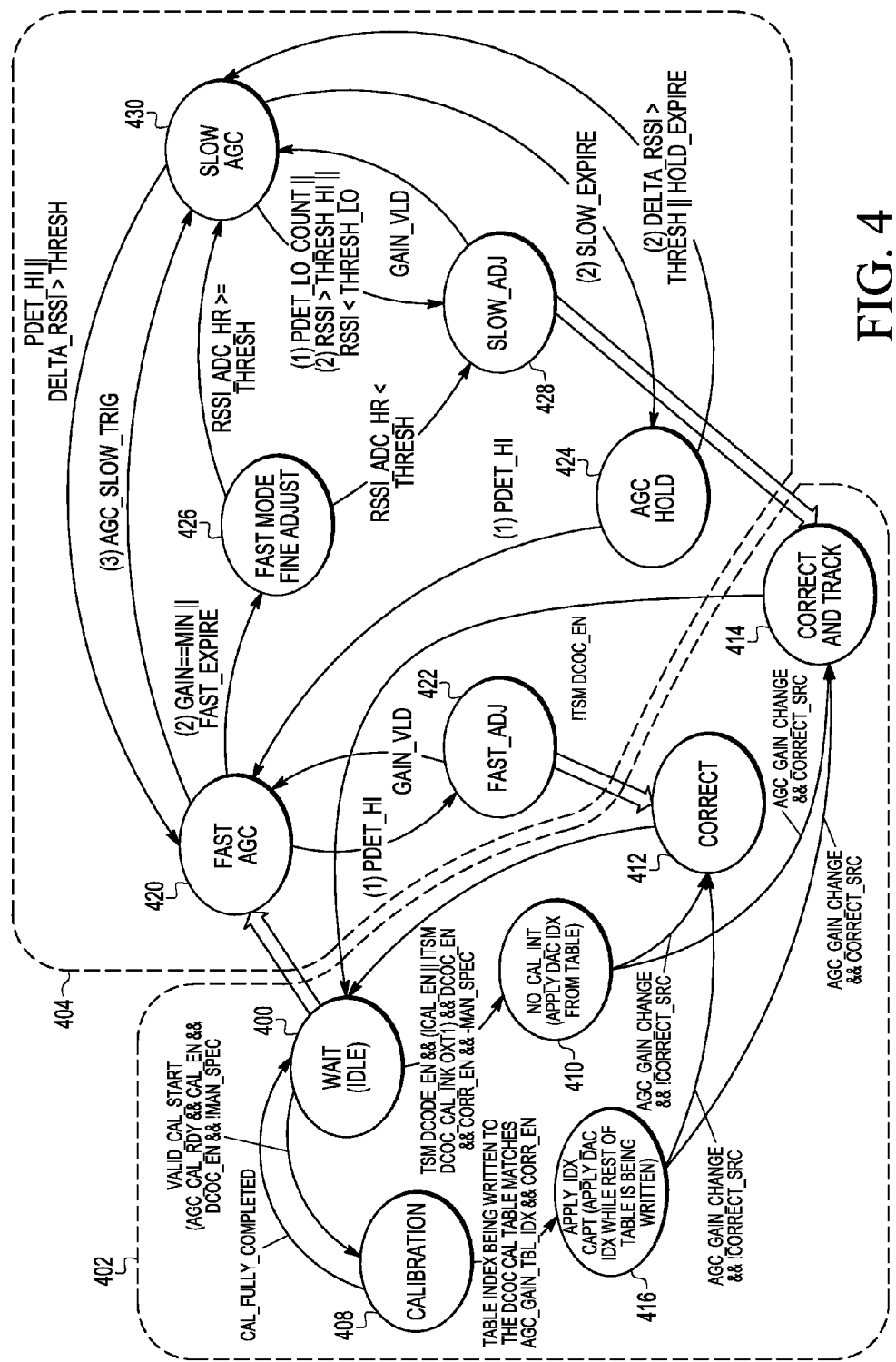
FIG. 4 illustrates an example state diagram of an automatic gain control module, I/Q mismatch calibration and correction, and DC offset calibration and correction according to some embodiments.

FIG. 4 illustrates an example of an I/Q mismatch and DC offset calibration/correction state diagram 402 and an AGC module state diagram 404 according to some embodiments. Each state transition is illustrated by an arrow with a thin line, where a state transition occurs when a transition condition is met. Some state transitions illustrated in FIG. 4 are prioritized, as indicated by the number value in parentheses. A highest priority transition is illustrated with (1), while a next-highest priority transition is illustrated with (2), and so on. If more than one transition condition is met or satisfied, the highest priority transition of those satisfied transition conditions is taken. Arrows with the thick lines indicate states in calibration/correction state diagram 402 that can be concurrent with states in AGC module state diagram 404. For example, when calibration/correction state diagram 402 is in idle state 400, AGC module can be in fast AGC state 420. When AGC module state diagram 404 is in fast adjust state 422, calibration/correction state diagram 402 can be in correct state 412. When AGC module state diagram 404 is in slow adjust state 428, calibration/correction state diagram 402 can be in correct and track state 414.

On reset or power up of receiver system 100 (e.g., reset signal is set), the receiver system 100 enters idle state 400 in I/Q mismatch and DC offset calibration/correction state diagram 402. A valid calibration start indicator is triggered (shown as VALID_CAL_START) when the AGC module is ready for calibration (AGC_CAL_RDY), calibration is enabled (CAL_EN), DC offset correction is enabled (DCOC_EN), and manually specified correction (MAN_SPEC) is enabled. When the VALID_CAL_START indicator is set, receiver system 100 transitions from idle state 400 to calibration state 408. When a table index being written to a DC offset correction calibration table matches the index of an AGC gain table (AGC_GAIN_TBL_IDX) and correction is enabled (CORR_EN), receiver system 100 transitions from the calibrating state 408 to the apply index state (APPLY_IDX_CAPT) 416 where the digital to analog converter index is applied to use in gain lookup tables while the rest of the DC offset correction table is being written by the AGC module. Calibrating state 408 transitions to idle state 400 when calibration is fully completed.

Apply index state 416 transitions to correct state 412 to correct the DC offset by adjusting the rest of the gain profile in receiver system 100 when AGC module 145 determines that specified criteria are met, such as, for example, that a gain adjustment is required (AGC_GAIN_CHANGE) and a system reset controller indicates correction is not required (!CORRECT_SRC).

Correct state 412 transitions to the idle state 400 once the gain profile is adjusted and a transceiver sequence manager (not shown) in receiver system 100 determines that DC offset correction is not enabled, such as, for example, during debug.

Apply index state 416 transitions to correct and track state 414 to correct and to track DC offset when the gain profile in receiver system 100 is changed when AGC module 145 determines that specified criteria are met, such as, for example, that a gain adjustment is required (AGC_GAIN_CHANGE) and a system reset controller in receiver system 100 indicates correction is required. IQ mismatch gain and phase Imbalance is computed either as part of factory calibration or adaptively in process 408 for example. However, for DCOC calibration & operation I/Q mismatch compensation (IQMC) is assumed to be applied. (CPRRECT_SRC). Correct and track state 414 transitions to the idle state 400 once the gain profile is adjusted and the transceiver sequence manager in receiver system 100 determines that DC offset correction is not enabled (!TSM_DCOC-EN).

Receiver system 100 transitions from idle state 400 to no calibration initialization state 410 when calibration is to be performed without calibration initialization. For example, state 400 transitions to no calibration initialization state 410 when the transceiver sequence manager DC offset enable correction is enabled (TSM_DCODE_EN), calibration is not enabled (!CAL_EN) or the transceiver sequence manager DC offset correction extended calibration initialization (DCOC_CAL_IN) is not set, and DC offset correction is enabled (DCOC_EN), correction is enabled (CORR_EN), and a user is not manually controlling DC offset (−MAN_SPEC). State 410 transitions to state 412 to correct the DC offset by adjusting the rest of the gain profile in receiver system 100 when AGC module 145 determines that a gain adjustment is required (AGC_GAIN_CHANGE) and system reset controller indicates correction is not required (!CORRECT_SRC). State 410 transitions to state 414 to correct and to track DC offset when a change in the gain profile in receiver system 100 is required (AGC_GAIN_CHANGE) and a system reset controller (not shown) in receiver system 100 indicates correction is required (CORRECT_SRC).

AGC module 145 enters fast AGC state 420 upon trigger of a receiver initialization signal. In some embodiments, the receiver system is initialized at a maximum front-end gain (e.g., TCA/TZA and BBF are set to a maximum gain), as indicated by a gain value in a programmable register. Once in fast AGC state 420, AGC module's control of the gain elements in the receiver system is enabled and AGC module monitors the peak detectors and RSSI circuit for signals that indicate whether or not gain adjustment is required.

From fast AGC state 420, AGC module transitions to one of fast adjust (FAST-ADJ) state 422, fast fine adjust (also referred to as "preslow") state 426, or slow AGC state 430, based on prioritized transition conditions. AGC module transitions to fast adjust state 422 upon receipt of a pdet_hi signal from one of the peak detectors (e.g., PDET_HI is set, indicating the signal passed by the receiver system has exceeded the high threshold and is too strong), which is a first (or highest) priority transition from fast AGC state 420. Once in fast adjust state 422, AGC module decreases the front-end gain of receiver system by adjusting one or more gain control signals of the gain elements in the receiver system (e.g., TCA, TZA, BBF). In some embodiments, the gain adjustments made in fast adjust state 422 are large in order to quickly adjust the signal to be within the high threshold. From fast adjust state 422, AGC module transitions back to fast AGC state 420 once a valid gain adjustment is applied to the one or more gain elements (e.g., GAIN_VLD), which includes a gain adjustment of zero if the front-end gain has already been adjusted to a minimum front-end gain level. Once a valid gain adjustment is applied, RSSI circuit is reset and the peak detectors are disabled (e.g., clear signals 186 and 187 are triggered) for a programmable amount of time that is related to the bandwidth of the gain elements and expected settling time based on signal dynamics.

In some embodiments (not shown), fast AGC state 420 transitions to fast adjust state 422 also upon detection that the low peak monitoring window has expired. In such embodiments, AGC module increases the front-end gain of receiver system by adjusting one or more gain control signals, which may be large gain adjustments to quickly adjust the signal to exceed the low threshold.

From fast AGC state 420, AGC module transitions to fast mode fine adjust state 426 upon detection that the front-end gain is equal to a minimum front-end gain level (e.g., GAIN==MIN), indicating that front-end gain cannot be further reduced), or upon detection that a fast gain change detection window has expired (e.g., FAST_EXPIRE, where detection of a gain adjustment resets the fast gain change detection window or time period, and expiration of the fast gain change detection window indicates that no gain adjustments have been made during the fast gain change detection window). This transition is a second (or next-highest) priority transition from fast AGC state 420. Once in fast mode fine adjust state 426, AGC module 145 also monitors digital measurements and detections of RSSI circuit 150, such as the ADC headroom of ADC-I and ADC-Q (RSSI_ADC_HR<THRESH), which is the difference between a maximum amplitude of the passed signal and the maximum amplitude that can be handled by the ADC without clipping or loss of the signal (also referred to as a saturation level). If the ADC headroom is less than a headroom threshold (indicating that additional headroom is desired), AGC module transitions to slow ADJ state 428. If the ADC headroom is greater or equal to the headroom threshold (RSSI_ADC_HR≥THRESH) (indicating that the present headroom is satisfactory), AGC module transitions to slow AGC state 430.

In slow ADJ state 428, AGC module decreases the front-end gain (if possible) to increase ADC headroom. In some embodiments, the gain adjustments made in slow ADJ state 428 are small in order to "fine tune" the signal passed by the receiver system. From slow ADJ state 428, AGC module transitions to slow AGC state 430 once a valid gain adjustment is applied to the one or more gain elements (e.g., GAIN_VLD), which includes a gain adjustment of zero if the front-end gain has already been adjusted to a minimum front-end gain level. Once a valid gain adjustment is applied, RSSI circuit is reset and the peak detectors are disabled (e.g., clear signals 186 and 187 are triggered) for a programmable amount of time that is related to the bandwidth of the gain elements and expected settling time based on signal dynamics.

In slow AGC state 430, AGC module 145 monitors peak detectors and RSSI circuit 150. From slow AGC state 430, AGC module transitions to one of fast AGC state 420, slow ADJ state 428, or AGC hold state 424, based on prioritized transition conditions. AGC module transitions to fast AGC state 420 upon receipt of the detection signal pdet_hi (e.g., PDET_HI is set, indicating the signal passed by the receiver system has exceeded the high threshold and is too strong), which may result when an interference signal is present to interrupt the signal passed by the receiver system. AGC module also transitions to fast AGC state 420 upon detection that a change in RSSI level (or DELTA_RSSI) of one of the I-channel or Q-channel is greater than the delta RSSI threshold. A large spike in RSSI level may indicate an interference signal is present, while a large drop in RSSI level may indicate an interference signal is no longer present. This transition is a first (or highest) priority transition from slow AGC state 430.

AGC module transitions from slow AGC state 430 to slow ADJ state 428 upon detecting that the low peak monitoring window has expired (e.g., PDET_LO count reaches a maximum value, indicating that the signal passed by the receiver system has not exceeded the low threshold within the monitoring window and is too weak). AGC module also transitions to slow ADJ 428 upon detection that a present RSSI level of one of the I-channel or Q-channel is above a high RSSI threshold or below a low RSSI threshold, indicating that the I-channel or Q-channel is too strong or too weak, respectively. This transition is a second (or next-highest) priority transition from slow AGC state 430. Once in slow ADJ state 428, AGC module increases front-end gain to increase the strength of the respective I-channel or Q-channel signal (if the present RSSI level indicates that the signal is too weak or if the low peak monitoring window has expired), or decreases front-end gain (if possible) to decrease the strength of the respective I-channel or Q-channel signal (if the present RSSI level indicates that the signal is too strong). AGC module also resets the low peak monitoring window.

From slow AGC state 430, AGC module transitions to AGC hold state 424 upon detection that a slow gain change detection window has expired (e.g., SLOW_EXPIRE, where detection of a gain adjustment resets the slow gain change detection window or time period, and expiration of the slow gain change detection window indicates that no gain adjustments have been made during the slow gain change detection window). This transition is a second priority transition from slow AGC state 430. Once in AGC hold state 424, AGC module's control of the gain elements in the receiver system is disabled and the front-end gain is maintained at the presently-set level. AGC module also continues to monitor the peak detectors and RSSI circuit. During AGC hold state 424, a processor of the receiver system has identified that a valid packet is received and the processor is in a demodulation state, or a state in which packets of a data transmission are detected and received.

AGC module transitions from AGC hold state 424 to either fast AGC state 420 or slow AGC state 430, based on prioritized transition conditions. From AGC hold state 424, AGC module transitions to fast AGC state 420 upon receipt of the detection signal pdet_hi (e.g., PDET_HI is set, indicating the signal passed by the receiver system has exceeded the high threshold and is too strong), which may result when an interference signal is present to interrupt the signal passed by the receiver system. This transition is a first (or highest) priority transition from AGC hold state 424. In some embodiments, AGC module also transitions to fast AGC state 420 in response to the receiver system restarting the receive sequence.

From AGC hold state 424, AGC module transitions back to slow AGC state 430 upon detection that a change in RSSI level (or DELTA_RSSI) of one of the I-channel or Q-channel is greater than a delta RSSI threshold. A large spike in RSSI level may indicate an interference signal is present and front-end gain should be reduced to compensate for the interference (e.g., from slow AGC state 430, AGC module transitions to slow ADJ state 428 due to a present RSSI level being greater than a high RSSI threshold). A large drop in RSSI level may indicate an interference signal is no longer present and front-end gain should be increased to compensate for the lack of interference (e.g., from slow AGC state 430, AGC module transitions to slow ADJ state 428 due to a present RSSI level being less than a low RSSI threshold). AGC module also transitions to slow AGC state 430 upon detection that a hold operation window has expired (e.g., HOLD_EXPIRE, where the hold operation window is a programmable period of time that indicates a maximum amount of time during which the AGC module remains in AGC hold state). This transition is a second (or next-highest) priority transition from AGC hold state 424.

Finally, from fast AGC state 420, AGC module transitions to slow AGC state 430 upon detection that the processor of the receiver system is in a packet detection and receipt state (e.g., AGC_SLOW_TRIG), indicating that the receiver system has achieved an initial gain level used to successfully detect and receive packets of a data transmission. This is a third (or least highest) priority transition from fast AGC state 420. AGC slow trigger is set when a desired signal attribute is received, such as upon receipt of the packet header after the preamble. In this manner, slow AGC state 430 and slow ADJ 428 provide fine tuning of the signal passed by receiver system using smaller steps in gain, while fast AGC state 420 and fast adjust state 422 provide quick coarse tuning of the signal passed by receiver system using larger steps in gain. In this manner, AGC module provides a better quality version of the signal passed by the receiver system.

By now it should be appreciated that there has been provided embodiments of a receiver system are disclosed herein for dynamically calibrating and adjusting a direct conversion receiver system. One embodiment includes applying (422 Fast ADJ or 428 Slow ADJ) one or more gain control signals (165, 170) to one or more gain elements (e.g., TCA, TZA, BBF) of a receiver system (100), where the applying one or more gain control signals results in a gain change to the receiver system; in response to the gain change, determining (412 Correct or 414 Correct & Track) whether the receiver system exhibits a DC offset; and in response to a determination that the receiver system exhibits the DC offset, applying (412 or 414) one or more DC offset correction control signals to one or more gain elements of the receiver system, where the one or more DC offset correction signals are configured to correct the DC offset.

In another aspect, the method can further comprise detecting a gain adjustment indicator (e.g., pdet_hi, pdet_lo, RSSI) in the receiver system, wherein the detecting the gain adjustment indicator occurs prior to the applying the one or more gain control signals. In response to the detecting the gain adjustment indicator, a selected gain profile from a plurality of gain profiles (172) associated with the receiver system can be determined. Each of the plurality of gain profiles can correspond to one of a plurality of receiver gain levels of the receiver system, and the selected gain profile can comprise the one or more gain control signals.

In another aspect, the gain adjustment indicator can comprise a high peak detection signal that indicates a signal clip (pdet_hi) of the receiver system. The selected gain profile can be determined to reduce a present receiver gain level by a large step (e.g., 422 Fast ADJ).

In another aspect, the gain adjustment indicator can comprise at least one or more of an RSSI (received signal strength indicator) value that exceeds a maximum threshold value (rssi>thresh_hi) and an RSSI headroom value that fails to exceed a minimum headroom threshold value (rssi_adc_hr<thresh). The selected gain profile is determined to reduce a present receiver gain level by a small step (e.g., 428 Slow ADJ).

In another aspect, the gain adjustment indicator can comprise at least one or more of an absence of a low peak detection signal (pdet_lo) and an RSSI (received signal strength indicator) value that fails to exceed a minimum threshold value (rssi<thresh_lo), and the selected gain profile is determined to increase a present receiver gain level by a small step (e.g., 428 Slow ADJ).

In another aspect, the method can further comprise asserting a gain change signal (agc_gain_change) to indicate the gain change of the receiver system. The gain change signal can be asserted after a monitoring time (e.g., fast_expire) has elapsed (e.g., after gain has settled). The monitoring time begins in response to the detecting the gain adjustment indicator. A subsequent gain adjustment indicator is not detected during the monitoring time. Determining whether the receiver system exhibits the DC offset is performed in response to the asserting the gain change signal.

In another aspect, the method can further comprise in response to detecting the subsequent gain adjustment indicator during the monitoring time, determining a subsequent gain profile from the plurality of gain profiles (172), applying one or more gain control signals of the subsequent gain profile to one or more gain elements of the receiver system, and resetting the monitoring time in response to detecting the subsequent gain adjustment indicator.

In another aspect, the method can further comprise incrementing a gain adjustment count (e.g., 5 tries) in response to the applying one or more gain control signals of the subsequent gain profile. The gain change signal can be asserted in response to the gain adjustment count reaching a maximum count.

In other embodiments, a method can comprise applying (308/422 Fast ADJ or 428 Slow ADJ) a first gain profile to a receiver system (100). The first gain profile can comprise one or more gain control signals (165, 170). Each of the one or more gain control signals can correspond to a respective gain element of one or more gain elements (TCA, TZA, BBF) of the receiver system. The one or more gain control signals implement a present gain setting of the receiver system. Detecting (310/422 or 428) whether the present gain setting of the receiver system requires a gain adjustment within a monitoring time (e.g., fast_expire, slow_expire). The monitoring time begins in response to the applying the first gain profile. In response to a detection that the present gain setting does not require the gain adjustment within the monitoring time (e.g., gain has settled), the method can include determining (314/412 Correct or 414 Correct & Track) whether the receiver system exhibits a DC offset. In response to a determination that the receiver system exhibits the DC offset, (314/412 or 414) one or more DC offset correction signals can be applied to one or more gain elements of the receiver system. The one or more DC offset correction signals are configured to correct the DC offset.

In another aspect, the method can further comprise in response to a detection that the present gain setting requires the gain adjustment within the monitoring time, selecting (310/422 Fast ADJ) a second gain profile from a plurality of gain profiles associated with the receiver system. Each of the plurality of gain profiles are associated with a corresponding gain setting of the receiver system, and the second gain profile is selected to implement the gain adjustment. The second gain profile can be applied to the receiver system. The monitoring time can be reset in response to the applying the second gain profile.

In another aspect, the method can further comprise in response to expiration of the monitoring time without detecting that the present gain setting requires a subsequent gain adjustment, determining whether the receiver system exhibits a subsequent DC offset.

In another aspect, in response to the determination that the receiver system exhibits the DC offset, the one or more DC offset correction signals can be calculated, and the present gain profile of the receiver system can be updated to include the one or more DC offset correction signals.

In another aspect, the method can further comprise performing DC offset calibration of the receiver system prior to enabling the receiver system for RF (radio frequency) signal receipt. The plurality of gain profiles can each comprise a plurality of estimated DC offset calibration signals for the one or more gain elements of the receiver system. I/Q (in-phase/quadrature) phase and gain mismatch calibration of the receiver system can be performed prior to enabling the receiver system for RF (radio frequency) signal receipt. The plurality of gain profiles can each comprise a corresponding I/Q (in-phase/quadrature) mismatch factor.

In other embodiments, a method can comprise monitoring a receiver system (100) to determine whether a present gain setting of the receiver system requires any coarse gain adjustments (420 Fast AGC). The present gain setting can be implemented by a plurality of gain control signals (165, 170), and each of the plurality of gain control signals can be received by one of a plurality of gain elements (TCA, TZA, BBF) of the receiver system. In response to a coarse gain adjustment made to the present gain setting, whether the receiver system exhibits a DC offset (412 Correct) can be determined. In response to a determination that the receiver system exhibits the DC offset, one or more DC offset correction control signals can be applied to the plurality of gain elements of the receiver system (412 Correct). The one or more DC offset correction control signals can be configured to correct the DC offset.

In another aspect, the method can further comprise in response to expiration of a coarse gain adjustment monitoring time (fast_expire), monitoring the receiver system to determine whether the present gain setting requires any fine gain adjustments (430 Slow AGC). In response to a fine gain adjustment made to the present gain setting, whether the receiver system exhibits a DC offset (414 Correct & Track) can be determined.

In another aspect, the fine gain adjustment is made in response to detection of at least one or more of an RSSI (received signal strength indicator) value that exceeds a maximum threshold value (rssi>thresh_hi), the RSSI value that fails to exceed a minimum threshold value (rssi<thresh_lo), an RSSI headroom value that fails to exceed a minimum headroom threshold value (rssi_adc_hr<thresh), and an absence of a low peak detection signal (pdet_lo).

In another aspect, the coarse gain adjustment is made in response to detection of a signal clip of the receiver system, and the one or more DC offset correction signals are each configured to correct a respective DC offset component exhibited by a respective gain element of the plurality of gain elements.

In another aspect, the method can further comprise in response to receipt of a preamble detect signal from a modem of the receiver system, monitoring the receiver system to determine whether the present gain setting requires any fine gain adjustments (430 Slow AGC).

In another aspect, the method can further comprise in response to receipt of a packet synchronization signal from a modem of the receiver system, maintaining the present gain setting of the receiver system (424 AGC hold).

In another aspect, the method can further comprise restarting the receiver system in response to receipt of a combination of a packet synchronization signal and a packet pass/fail signal from a modem of the receiver system (324 demodulation completes, return to 306 enable RF).

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   detecting gain adjustment indicators in a receiver system;
   evaluating the gain adjustment indicators and taking a highest priority transition to another state in the receiver system when transition conditions based on the gain adjustment indicators are met for transitioning to at least two different states with different priorities in the receiver system, wherein different ones of the gain adjustment indicators are evaluated depending on a current state in the receiver system being a fast automatic gain control (AGC) state or a slow AGC state;
   applying one or more gain control signals to one or more gain elements of the receiver system according to the current state of the receiver system, wherein
      the applying one or more gain control signals results in a gain change to the receiver system;
   in response to the gain change, determining whether the receiver system exhibits a DC (direct current) offset; and
   in response to a determination that the receiver system exhibits the DC offset, applying one or more DC offset correction control signals to the one or more gain elements of the receiver system, wherein the one or more DC offset correction signals are configured to correct the DC offset.

2. The method of claim 1, further comprising:
   in response to the detecting the gain adjustment indicators, determining a selected gain profile from a plurality of gain profiles associated with the receiver system, wherein
      each of the plurality of gain profiles corresponds to one of a plurality of receiver gain levels of the receiver system, and the selected gain profile comprises the one or more gain control signals.

3. The method of claim 2, wherein
   the gain adjustment indicators comprise a high peak detection signal that indicates a signal clip of the receiver system, and
   the selected gain profile is determined to reduce a present receiver gain level by a coarse gain adjustment.

4. The method of claim 2, wherein
   the gain adjustment indicators comprise at least one or more of an RSSI (received signal strength indicator) value that exceeds a maximum threshold value and an RSSI headroom value that fails to exceed a minimum headroom threshold value, and
   the selected gain profile is determined to reduce a present receiver gain level by a fine gain adjustment.

5. The method of claim 2, wherein
   the gain adjustment indicators comprise at least one or more of an absence of a low peak detection signal and an RSSI (received signal strength indicator) value that fails to exceed a minimum threshold value, and
   the selected gain profile is determined to increase a present receiver gain level by a small step.

6. The method of claim 2, further comprising:
   asserting a gain change signal to indicate the gain change of the receiver system, wherein
      the gain change signal is asserted after a monitoring time has elapsed,
      the monitoring time begins in response to the detecting the gain adjustment indicators, the gain change signal is asserted in response to a subsequent gain adjustment indicator not being detected during the monitoring time, and the determining whether the receiver system exhibits the DC offset is performed in response to the asserting the gain change signal.

7. The method of claim 6, further comprising:

in response to detecting the subsequent gain adjustment indicator during the monitoring time, determining a subsequent gain profile from the plurality of gain profiles;

applying one or more gain control signals of the subsequent gain profile to the one or more gain elements of the receiver system; and resetting the monitoring time in response to detecting the subsequent gain adjustment indicator.

8. The method of claim 7, further comprising:

incrementing a gain adjustment count in response to the applying one or more gain control signals of the subsequent gain profile, wherein the gain change signal is asserted in response to the gain adjustment count reaching a maximum count.

9. A method comprising:

detecting gain adjustment indicators in a receiver system;

evaluating the gain adjustment indicators and taking a highest priority transition to another state in the receiver system when transition conditions based on the gain adjustment indicators are met for transitioning to at least two different states with different priorities in the receiver system, wherein different ones of the gain adjustment indicators are evaluated depending on a current state of the receiver system being a fast automatic gain control (AGC) state or a slow AGC state;

applying a first gain profile to the receiver system according to the current state of the receiver system, wherein the first gain profile comprises one or more gain control signals, each of the one or more gain control signals corresponds to a respective gain element of one or more gain elements of the receiver system, and the one or more gain control signals implement a present gain setting of the receiver system;

detecting whether the present gain setting of the receiver system requires a gain adjustment within a monitoring time, wherein the monitoring time begins in response to the applying the first gain profile;

in response to a detection that the present gain setting does not require the gain adjustment within the monitoring time, determining whether the receiver system exhibits a DC offset; and in response to a determination that the receiver system exhibits the DC offset, applying one or more DC offset correction signals to the one or more gain elements of the receiver system, wherein the one or more DC offset correction signals are configured to correct the DC offset.

10. The method of claim 9, further comprising:

in response to a detection that the present gain setting requires the gain adjustment within the monitoring time, selecting a second gain profile from a plurality of gain profiles associated with the receiver system, wherein each of the plurality of gain profiles are associated with a corresponding gain setting of the receiver system, and the second gain profile is selected to implement the gain adjustment;

applying the second gain profile to the receiver system; and resetting the monitoring time in response to the applying the second gain profile.

11. The method of claim 10, further comprising:

in response to expiration of the monitoring time without detecting that the present gain setting requires a subsequent gain adjustment, determining whether the receiver system exhibits a subsequent DC offset.

12. The method of claim 9, wherein in response to the determination that the receiver system exhibits the DC offset, calculating the one or more DC offset correction signals; and updating the present gain profile of the receiver system to include the one or more DC offset correction signals.

13. The method of claim 9, further comprising:

performing DC offset calibration of the receiver system prior to enabling the receiver system for RF (radio frequency) signal receipt, wherein each gain profile of a plurality of gain profiles comprises a plurality of estimated DC offset calibration signals for the one or more gain elements of the receiver system; and performing I/Q (in-phase/quadrature) phase and gain mismatch calibration of the receiver system prior to enabling the receiver system for RF (radio frequency) signal receipt, wherein the plurality of gain profiles each comprise a corresponding I/Q mismatch factor.

14. A method comprising:

detecting gain adjustment indicators in a receiver system;

evaluating the gain adjustment indicators and taking a highest priority transition to another state in the receiver system when transition conditions based on the gain adjustment indicators are met for transitioning to at least two different states with different priorities in the receiver system, wherein different ones of the gain adjustment indicators are evaluated depending on a current state of the receiver system being a fast automatic gain control (AGC) state or a slow AGC state;

monitoring the receiver system to determine whether a present gain setting of the receiver system requires any gain adjustments, wherein the present gain setting is implemented by a plurality of gain control signals, and each of the plurality of gain control signals is received by one of a plurality of gain elements of the receiver system;

when the present gain setting of the receiver system requires adjustment, adjusting the present gain setting according to the current state of the receiver system;

in response to a gain adjustment made to the present gain setting, determining whether the receiver system exhibits a DC (direct current) offset; and in response to a determination that the receiver system exhibits the DC offset, applying one or more DC offset correction control signals to the plurality of gain elements of the receiver system, wherein the one or more DC offset correction control signals are configured to correct the DC offset.

15. The method of claim 14, further comprising:

in response to expiration of a coarse gain adjustment monitoring time, monitoring the receiver system to determine whether the present gain setting requires any fine gain adjustments; and in response to a fine gain adjustment made to the present gain setting, determining whether the receiver system exhibits a DC offset.

16. The method of claim 15, wherein
the fine gain adjustment is made in response to detection of at least one or more of an RSSI (received signal strength indicator) value that exceeds a maximum threshold value, the RSSI value that fails to exceed a minimum threshold value, an RSSI headroom value that fails to exceed a minimum headroom threshold value, and an absence of a low peak detection signal.

17. The method of claim 14, wherein
the gain adjustment is a coarse gain adjustment made in response to detection of a signal clip of the receiver system, and
the one or more DC offset correction signals are each configured to correct a respective DC offset component exhibited by a respective gain element of the plurality of gain elements.

18. The method of claim 14, further comprising:
in response to receipt of a preamble detect signal from a modem of the receiver system, monitoring the receiver system to determine whether the present gain setting requires any fine gain adjustments.

19. The method of claim 14, further comprising:
in response to receipt of a packet synchronization signal from a modem of the receiver system, maintaining the present gain setting of the receiver system.

20. The method of claim 14, further comprising:
restarting the receiver system in response to receipt of a combination of a packet synchronization signal and a packet pass/fail signal from a modem of the receiver system.

\* \* \* \* \*